United States Patent [19]
Nitta

[11] Patent Number: 5,471,335
[45] Date of Patent: Nov. 28, 1995

[54] SEMICONDUCTOR OPTICAL AMPLIFIER DEVICE AND A METHOD OF USING THE SAME

[75] Inventor: Jun Nitta, Sagamihara, Japan

[73] Assignee: Canon Kabushiki Kaisha, Tokyo, Japan

[21] Appl. No.: 972,413

[22] Filed: Nov. 5, 1992

[30] Foreign Application Priority Data

Nov. 11, 1991 [JP] Japan .................................. 3-322452

[51] Int. Cl.$^6$ .......................... H04B 10/17; H04B 10/04; H04B 10/06
[52] U.S. Cl. ......................... 359/179; 359/173; 359/176; 359/168; 359/125; 359/188; 359/195; 359/342; 359/344; 359/337; 359/346; 372/45; 372/50
[58] Field of Search .................................... 359/342, 344, 359/345, 337, 346, 119, 118, 125, 137, 152, 153, 160, 154, 161, 173, 174, 176, 179, 188, 195, 168; 372/39, 43, 45, 46, 50

[56] References Cited

U.S. PATENT DOCUMENTS

| | | | |
|---|---|---|---|
| 4,882,607 | 11/1989 | Shinada | 357/19 |
| 4,932,034 | 6/1990 | Usami | 372/46 |
| 5,177,758 | 1/1993 | Tabuchi | 372/50 |
| 5,272,714 | 12/1993 | Chen | 372/46 |
| 5,388,106 | 2/1995 | Oka | 372/50 |

FOREIGN PATENT DOCUMENTS 0238212 of 0000 European Pat. Off. .
0128297 of 0000 European Pat. Off. .

OTHER PUBLICATIONS

Pat. Abs. Jp., vol. 15, No. 147, Apr. 12, 1991 (and JP–A–03022581).
Pat. Abs. Jp., vol. 8, No. 229, Oct. 20, 1984 (JP–A–59111383). Atsushi.
Chen et al., "AlGaAs/GaAs Visible Ridge Waveguide Laser with Multicavity Structure," I.E.E.E. Journal of Quantum Electronics, vol. QE–23, No. 8, pp. 1283–1286 (Aug. 1987).
Mikami et al., "Emmission spectral width broadening for InGaAsP/InP superluminescent diodes," IEE Proceedings–J, vol. 138, No. 2, pp. 133–137 (Apr. 1991).
Bendelli et al., "A New Structure for High–Power TW–SLA," IEEE Photonics Technology Letters, vol. 3, No. 1, Abstract and FIG. 1 (Jan. 1991).

*Primary Examiner*—Leslie Pascal
*Attorney, Agent, or Firm*—Fitzpatrick, Cella, Harper & Scinto

[57] ABSTRACT

A semiconductor optical amplifier device has an amplification factor that does not vary even if an injection current thereinto is changed. The semiconductor amplifier device includes a laser structure and an active region formed in the laser structure along a waveguide thereof. The active region is constructed so that a carrier density distribution and a light distribution in the active region cooperate to keep a resonator length of the laser structure unchanged irrespective of the change in the injection current into the laser structure.

23 Claims, 13 Drawing Sheets

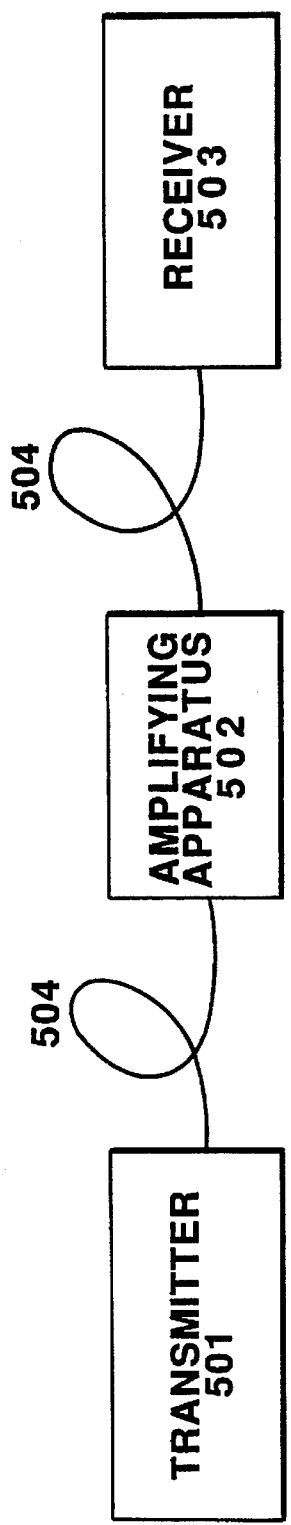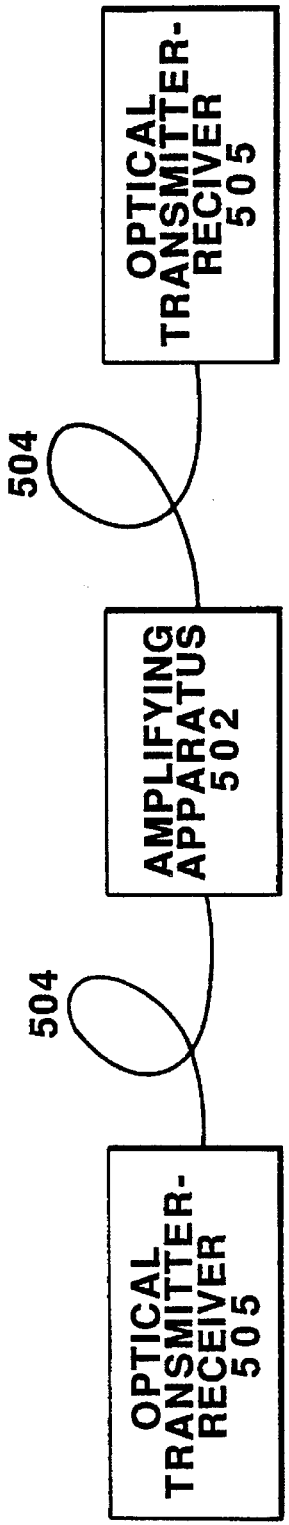

SEMICONDUCTOR OPTICAL AMPLIFIER DEVICE AND A METHOD OF USING THE SAME

BACKGROUND OF THE INVENTION

1. Field of the Invention

The present invention relates to a semiconductor optical amplifier device for performing induced emission by carriers in an active region and a method of using the same, such as an apparatus including the device and an optical communication system including the device.

2. Related Background Art

Conventionally, in prior art semiconductor optical amplifier apparatuses or devices, antireflection coatings are respectively formed on both opposite end surfaces of, for example, semiconductor laser structures, and population inversion is established in a high current injection state to amplify an input light by the induced emission.

However, since the amplification is conducted by injecting carriers into an active region of the prior art apparatus, the refractive index of the active region is varied in accordance with the injection state of carriers and a ripple wavelength caused by feedback at the end surfaces is changed.

When the injection current is small, the magnitude of ripple appearing in the amplification factor-wavelength dispersion characteristic is low and the change in oscillation wavelength will not largely affect the amplification factor in this wavelength range. In contrast thereto, when the injection current is large, the ripple of the amplification factor increases and the amplification factor is largely varied in response to only a small change in the amount of the injection current.

SUMMARY OF THE INVENTION

It is an object of the present invention to provide a semiconductor optical amplifier device, an apparatus including such amplifier device and a system in which such amplifier device is used.

According to an aspect of a semiconductor optical amplifier device of the present invention, there are arranged a semiconductor laser structure and an active region formed in the laser structure. At least a portion of the active region is constructed so that a carrier density distribution is uneven in the portion of the active region in an optical mode with respect to at least a predetermined direction when an injection current is injected into the active region. For example, this direction is in a plane perpendicular to a light propagationg direction in the active region, or parallel to a light propagating direction in the active region.

More concretely, a plurality of portions of the active region are arranged along a light propagating direction and unevenness of the carrier density distribution is different between the portions of the active region. The active region comprises a first portion having an active layer and a second portion having a plurality of active layers, the laser structure comprises a ridge waveguide structure having an electrode thereon and the electrode comprises a plurality of portions whose widths are different from each other, and the laser structure further comprises an antireflection coating formed on its end surface.

According to another aspect of a semiconductor optical amplifier device of the present invention, there are arranged a semiconductor laser structure and an active region formed in the laser structure. At least a portion of the active region is constructed so that an overlap integral between a carrier density distribution and a light distribution is uneven in the portion of the active region with respect to at least a predetermined direction when an injection current is injected into the active region.

According to further another aspect of a semiconductor optical amplifier device of the present invention, there are arranged a semiconductor laser structure and an active region formed in the laser structure. The active region is constructed so that a carrier density distribution and a light distribution in the active region cooperate to keep a resonator length of the laser structure unchanged irrespective of the change in an injection current into the laser structure.

A semiconductor optical amplifier device of the present invention can preferably be used in a light amplifying apparatus, various kinds of optical communication systems or networks and various kinds of apparatuses such as an optical transmitter, receiver and transceiver to be used in an optical communication system.

In this semiconductor optical amplifier apparatus, an overlap integral amount between a light distribution a nd a carrier density distribution is adjusted in at leasta portion thereof so that the refractive index sensed by the light distribution will not vary. This is due to formation of a region at which the refractive index increases (does not decrease) as a current density increases, and hence an optical length of a resonator of the optical amplifier apparatus will not change even if an injection current amount thereinto is varied.

Namely, in the semiconductor optical amplifier apparatus with a semiconductor laser structure according to the present invention, an active region in an optical mode is constructed so that a carrier density distribution is uneven, for example, in a plane perpendicular to a light propagating direction.

The change in refractive index due to a current injection generally results from plasma effect if thermal effect is disregarded, and the refractive index decreases as the injection current amount increases. However, if carriers are unevenly distributed in the active region in which light is to be amplified, there is a case where the refractive index (modal refractive index) sensed by the entire light distribution increases even though the refractive index is reduced due to plasma effect in respective regions as the injection current increases.

This phenomenon is caused by the fact that the carrier density distributions are independent from each other between the respective portions thereof while the light distribution acts as a mode (i.e., part of the mode interlocks with its entire one). That is, the phenomenon results from the fact that regions having different carrier densities are coupled to each other through the light distribution.

These advantages and others will be more readily understood in connection with tile following detailed description of the preferred embodiments in conjunction with the drawings.

BRIEF DESCRIPTION OF THE DRAWINGS

FIG. 9 is a view showing a uni-directional optical communication system in which a semiconductor optical amplifier apparatus of the present invention is used.

FIG. 10 is a view showing a bi-directional optical communication system in which a semiconductor optical amplifier apparatus of the present invention is used.

DESCRIPTION OF THE PREFERRED EMBODIMENT

Embodiments of the present invention will be described with reference to the drawings.

First Embodiment

Figure 1:
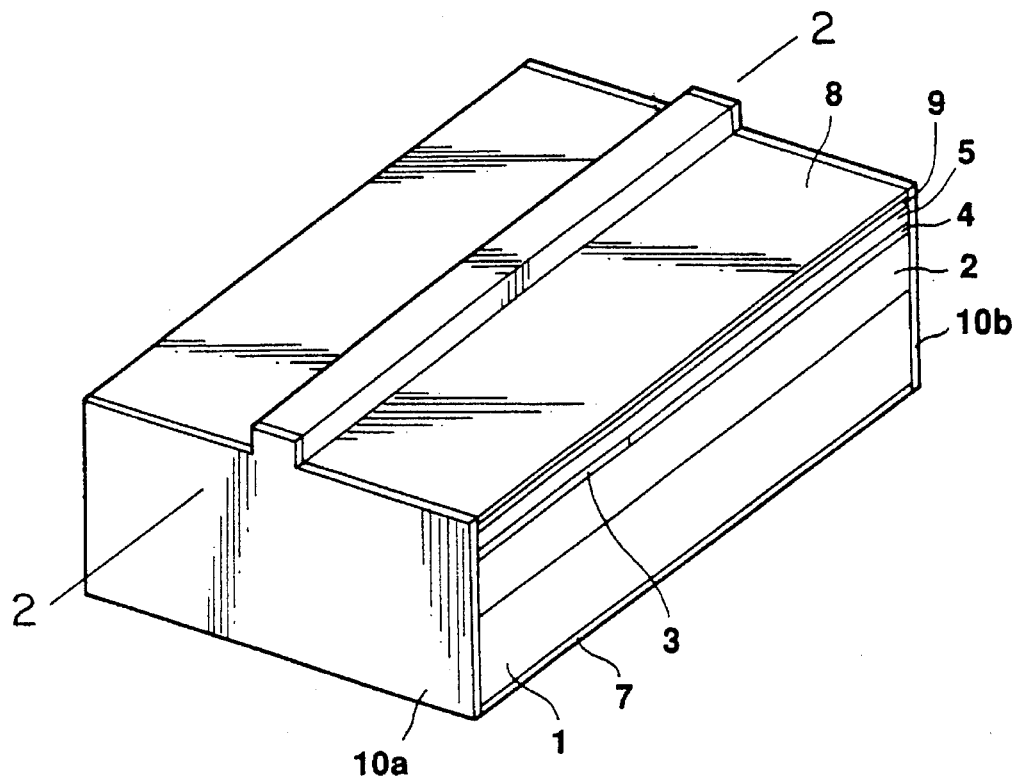
FIG. 1 is a perspective view of a first embodiment of a semiconductor optical amplifier apparatus according to the present invention.
Figure 2:
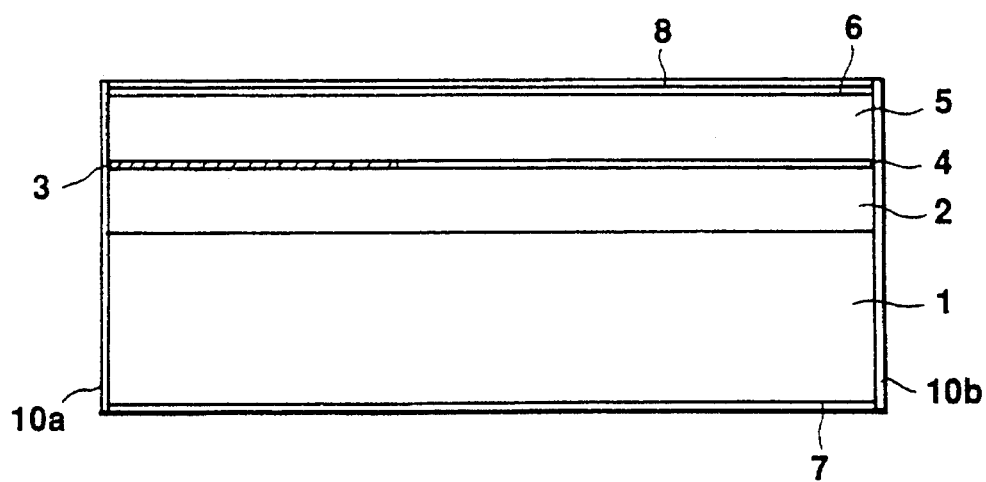
FIG. 2 is a cross-sectional view taken along an 2—2 line of FIG. 1.

FIGS. 1 and 2 show a first embodiment of the present invention.

In FIGS. 1 and 2, reference numeral 1 designates an n-GaAs substrate, reference numeral 2 designates an n-$Al_{0.5}Ga_{0.5}As$ first clad layer having a thickness of 1.5 µm, reference numeral 3 designates a first active layer, reference numeral 4 designates a second active layer having a structure different from that of the first active layer 3, reference numeral 5 designates a p-$Al_{0.5}As$ second clad layer having a thickness of 1.5 µm, reference numeral 6 designates a p-GaAs cap layer having a thickness of 0.5 µm, reference numeral 7 designates a first electrode formed on the substrate 1 and consisting of an Au—Ge alloy, reference numeral 8 designates a second electrode formed on the cap layer 6 and consisting of an Au—Cr alloy, reference numeral 9 designates an insulating layer of $Si_3N_4$ and reference numerals 10a and 10b respectively designate antireflection coatings of $ZrO_2$. In the first embodiment, a ridge or raised-channel waveguide structure is utilized for confinement in a lateral direction, but any structure can be used if the structure comprises a waveguide structure that can be used in semiconductor lasers.

Figure 3:
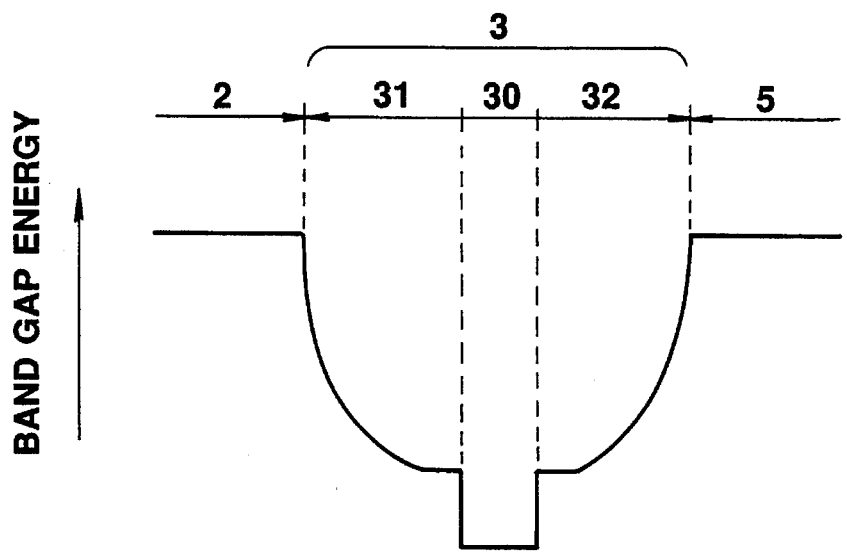
FIG. 3 is a view illustrating an energy band structure of a layer structure of a first active layer of the semiconductor optical amplifier apparatus shown in FIG. 1.
Figure 4:
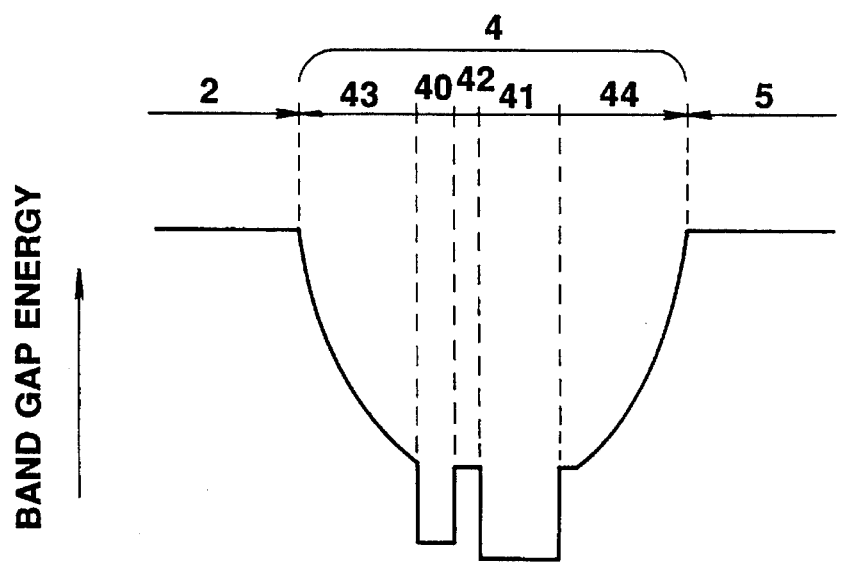
FIG. 4 is a view illustrating an energy band structure of a layer structure of a second active layer of the semiconductor optical amplifier apparatus shown in FIG. 1.

Structures of the first active layer 3 and the second active layer 4 will be described. The layer structure near the first active layer 3 is illustrated in FIG. 3 by means of an energy band structure thereof, and the layer structure of the second active layer 4 is illustrated in FIG. 4 by means of an energy band structure. As is shown in. FIG. 3, the first active layer 3 is composed of two GRIN (graded index) areas 31 and 30 where its refractive index is gradually changed and an undoped $Al_{0.05}Ga_{0.95}As$ layer 30 having a thickness of 50 nm interposed between the first clad layer 2 and tile second clad layer 5. As is shown in FIG. 4, the second active layer 4 is comprised of two GRIN areas 43 and 44, an undoped $Al_{0.2}Ga_{0.8}As$ active layer 40 having a thickness of 30 nm, an undoped $Al_{0.05}Ga_{0.95}As$ active layer 41 having a thickness of 50 nm and an undoped $Al_{0.3}Ga_{0.7}As$ layer 42 for separating the active layer 40 from the active layer 41 interposed between the first clad layer 2 and the second clad layer 5.

The operation of the first embodiment is as follows: In the first active layer 3, carriers are stored by injecting a current thereinto, and its refractive index is reduced due to plasma effect. In the second active layer 4 refractive indices of the two active areas 40 and 41 forming the second active layer 4 increase due to the carrier injection, depending on the magnitude of overlap integral between the carrier density distribution in the active areas 40 and 41 and the light distribution therein. Therefore, the directions of change in the refractive index sensed by light due to the change in current injection are different between the first active layer 3 and the second active layer 4. That is, one is negative while the other is positive.

Thus, $n_1L_1+n_2L_2$. ($n_1$ and $n_2$ are respectively equivalent or effective refractive indices of the first and the second active layers 3 and 4, and $L_1$ and $L_2$ are respectively lengths of the first and the second active layers 3 and 4) can be made constant irrespective of the change in the amount of the injection current. This results in leaving unchanged a peak wavelength which is caused by a resonance phenomenon due to-the end-surface reflection. Thus, the change in the amount of injection current is not accompanied by a change in the resonance wavelength, and the amplification operation is stabilized.

Second Embodiment

Figure 5:
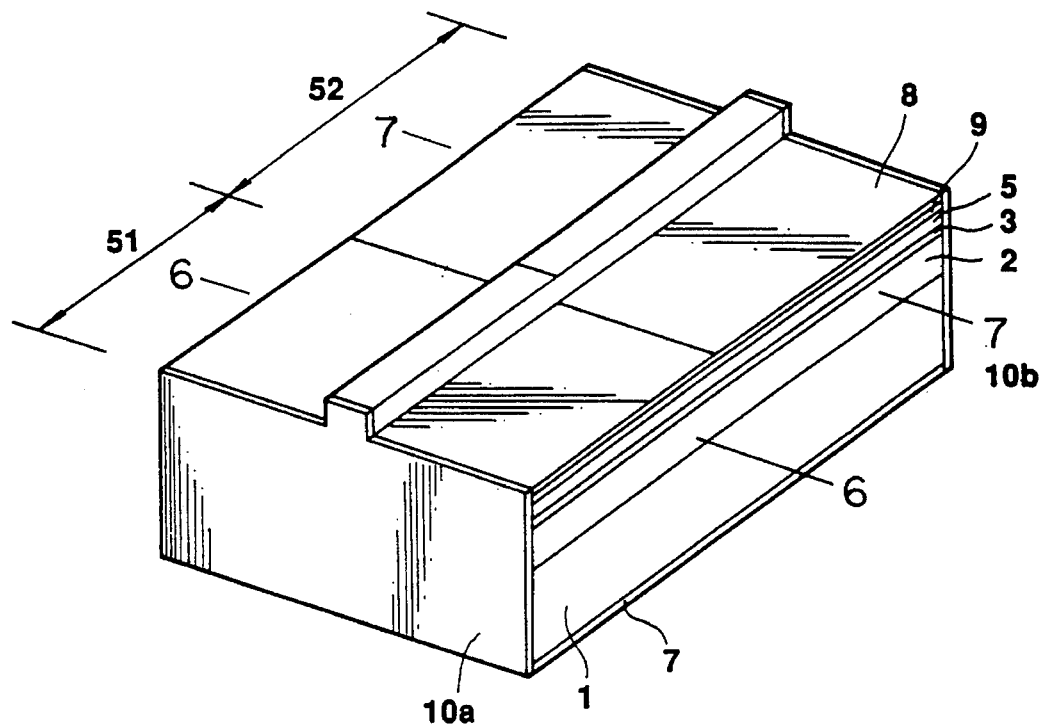
FIG. 5 is a perspective view of a second embodiment of a semiconductor optical amplifier apparatus according to the present invention.
Figure 6:
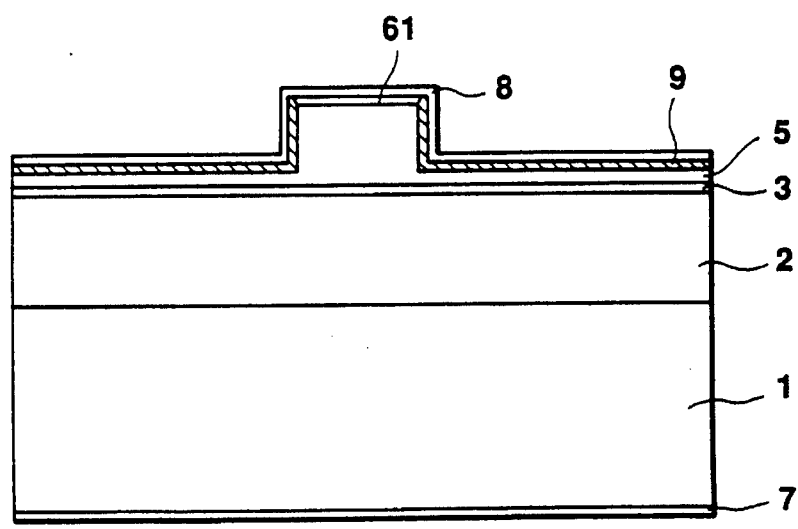
FIG. 6 is a cross-sectional view taken along a 6—6 line of FIG. 5.
Figure 7:
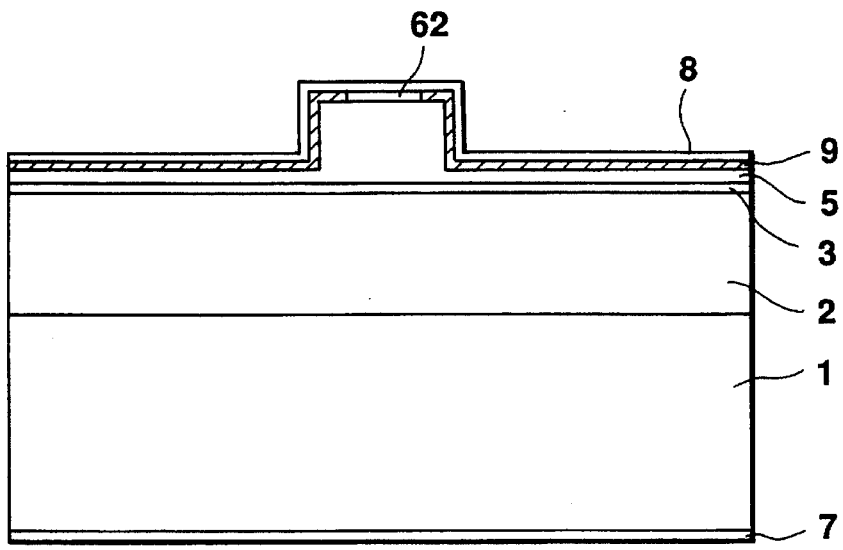
FIG. 7 is a cross-sectional view taken along a 7—7 line of FIG. 5.

FIG. 5 shows a second embodiment of the present invention. In FIG. 5, the same members or portions as those in FIG. 1 are designated by the same reference numerals as FIG. 1. A 6—6 cross-section of FIG. 5 is shown in FIG. 6 and a 7—7 cross-section of FIG. 5 is shown in FIG. 7. A portion having a structure shown in FIG. 6 is indicated by a first region 51 while a portion having a structure shown in FIG. 7 is indicated by a second region 52 in the following explanation.

The structural difference between the first region 51 and the second region 52 is in the difference in width of cap layers 61 and 62 on the top of a ridge structure. Due to such structural difference, the carrier density distribution in the active layer 3 can be made different between the first region 5i and the second region 52. In the first region 51, carriers are uniformly injected into the entire ridge structure, while, in the second region 52, carriers are unevenly distributed under the ridge structure since the width of the cap layer 62 is narrowed. As a result, the directions of change in the refractive index sensed by light, which is caused by the change in injection current, are opposite to each other between the first region 51 and the second region 52. Namely, in one region the refractive index increases while in the other region the refractive index decreases. Thus, similarly to the first embodiment, the amplification factor can be increased by increasing the injection current without varying the optical length of its resonator.

In the above-discussed embodiments, material of the GaAs series is used, but any material such as InP that can form a semiconductor laser can be used.

In the above-discussed embodiments, the ridge waveguide type is used as the structure of a semiconductor laser, but any structure that can form a semiconductor laser can be used.

Further, in the above embodiments, there are arranged a first region in which the refractive index increases as carriers increase and a second region in which the refractive index decreases as carriers increase, but only one region will suffice if light distribution and carrier density distribution in this region are controlled such that the refractive index sensed by light remains unchanged even if the change of carriers occurs.

Third Embodiment

Figure 8:
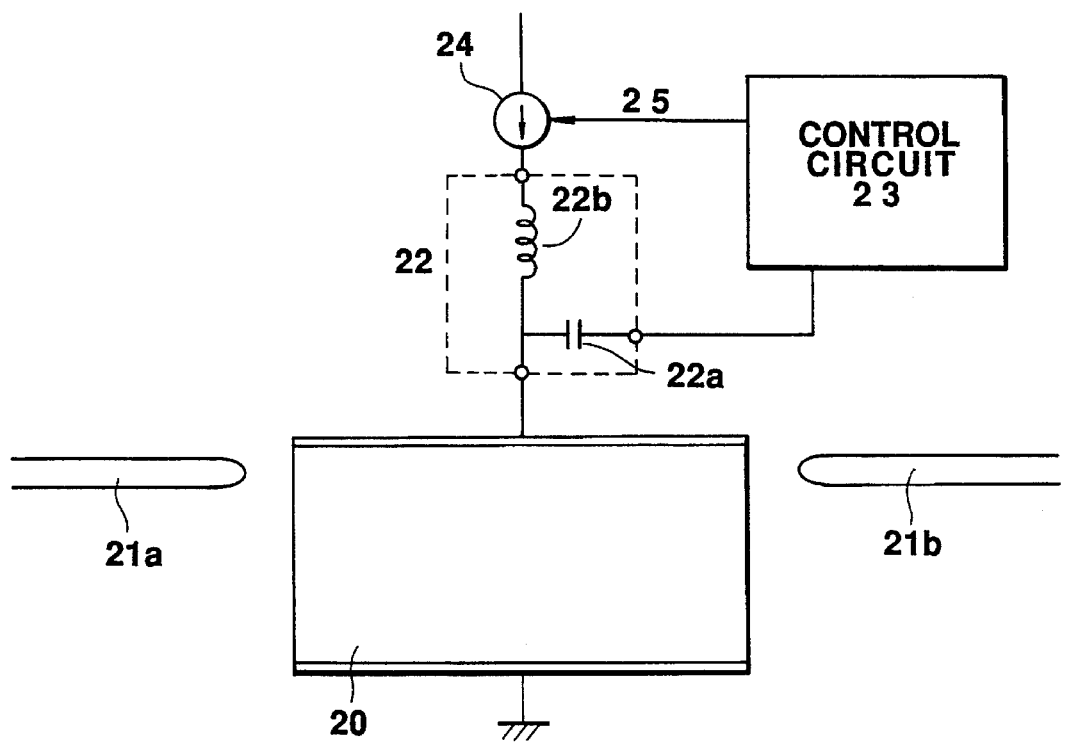
FIG. 8 is a view showing a method of using an semiconductor optical amplifier apparatus of the present invention.

FIG. 8 shows a method of using a semiconductor optical amplifier apparatus of the present invention.

In FIGS. 8, reference numeral 20 designates a semiconductor optical amplifier apparatus of the present invention, reference numerals 21a and 21b respectively designate optical fibers having a round tip, reference numeral 22 designates a bias T consisting of a capacitor 22a and an inductance 22b, reference numeral 23 designates a control circuit, reference numeral 24 designates a source for injecting a current into the semiconductor optical amplifier device 20 and reference numeral 25 designates a control signal to be supplied from the control circuit 23 to the source 24.

In the structure of FIG. 8, digital signals of an optical signal are transmitted and a sinusoidal wave signal having a sufficiently slower frequency than the bit rate of the transmitted digital signals is superposed thereon. The optical signal transmitted through the round-tip optical fiber 21a or 21b is coupled to a waveguide of the semiconductor optical amplifier device 20. The optical signal is amplified by the semisonductor optical amplifier device 20 and is again coupled to the round-tip optical fiber 21b or 21a. When the optical signal is amplified by the semiconductor optical amplifier device 20 in its constant-current operative state, a both-end voltage of the semiconductor optical amplifier device 20 between its both opposite electrodes is changed.

The change in the both-end voltage having the same frequency component as a modulated frequency of the optical signal is detected by the control circuit 23. The injection current into the semiconductor optical amplifier device 20 is adjusted by the source 24 so that the the change in the both-end voltage does not occur. Thus, an automatic power control (APC) of the semiconductor optical amplifier device 20 is performed.

In a case where a semiconductor optical amplifier device is controlled in that system, the change in the amplification factor is small even if the resonance wavelength is changed by the change in the amount of the injection current, in a state of a small gain ripple (a state of so-called traveling wave type amplifier) in which a product $(G_sR)$ of a feedback amount R due to the end-surface reflection and a single passage gain $G_s$ is small.

However, if $G_sR$ is made large by increasing the injection current of a prior art semiconductor optical amplifier device, the gain ripple increases (a state of a resonator type amplifier) and the amplification factor greatly varies in response to only a small change in the injection current.

By using the the semiconductor optical amplifier device of the present invention, the resonance wavelength does not vary even if the amount of the injection current is changed. Therefore, the amplification factor does not greatly vary even in the state of the resonator type and a stable amplification operation can be achieved.

Fourth Embodiment

FIG. 9 shows an optical transmission system in which the semiconductor optical amplifier apparatus of the first or second embodiment is used.

In FIG. 9, reference numeral 501 designates an optical transmitter, reference numeral 502 designates a semiconductor light amplifying apparatus in which the semiconductor optical amplifier device of the present invention is contained, referrence numeral 503 designates an optical receiver and reference numeral 504 designates an optical fiber.

Figure 16:
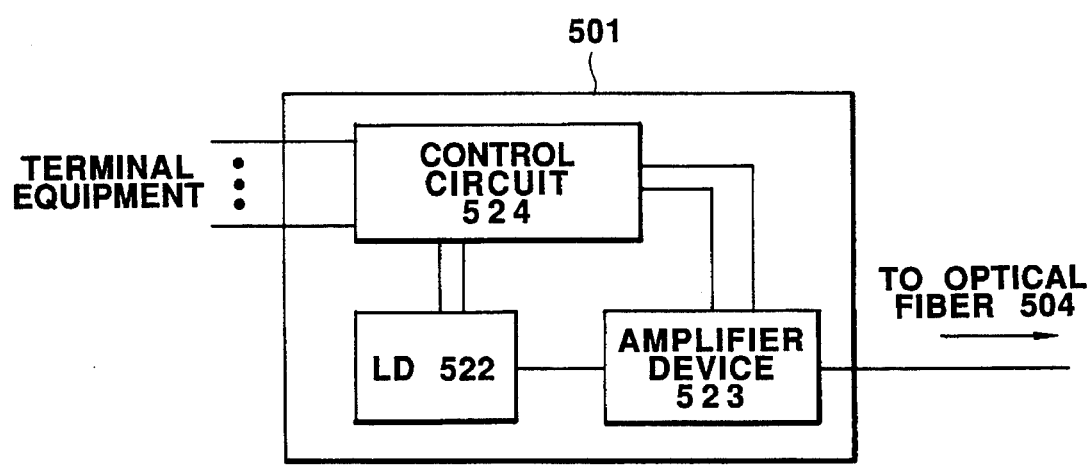
FIG. 16 is a view showing an optical transmitter of an optical communication system in which a semiconductor optical amplifier apparatus of the present invention ,is used.

The optical transmitter 501 is constructed as shown in FIG. 16. In FIG. 16, reference numeral 522 designates a semiconductor laser (LD) for transmission, reference numeral 523 designates a semiconductor optical amplifier device of the present invention and reference numeral 524 designates a control circuit. A source for supplying an injection current into both the semiconductor laser 522 and the semiconductor optical amplifier device 523 is needed, but in this case this source is contained in the control circuit 524.

The control circuit 524 supplies a signal from a terminal equipment to the semiconductor laser 522 to generate an optical signal and controls it for achieving the APC operation of the semiconductor optical amplifier device 523. The optical signal from the semiconductor laser 522 is amplified by the semiconductor optical amplifier device 523 and then is input into the optical fiber 504. In this case, the semiconductor optical amplifier device 523 is used as a so-called booster amplifier. This amplifier 523 will suffice if this is adjusted to the entire optical transmission system, and in this case only one amplifier is used as shown in FIG. 16. Two or more amplifiers can be used. Naturally, no booster amplifiers may be used only if the optical transmitter 501 functions well.

Figure 17:
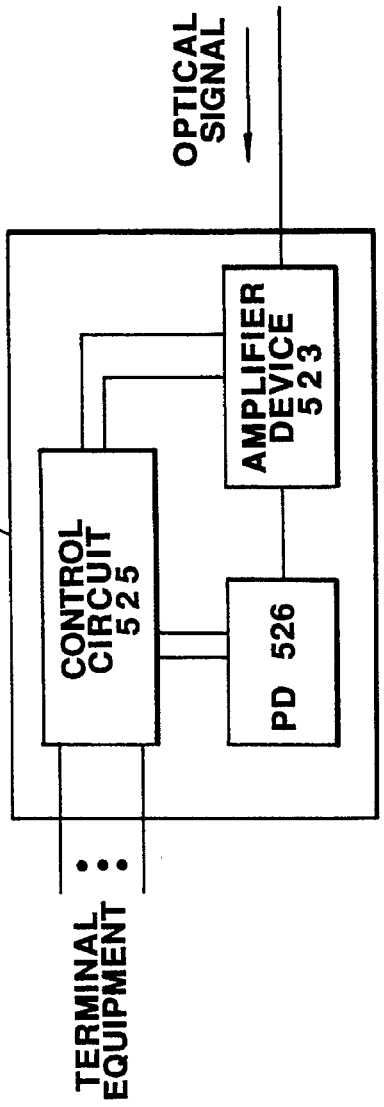
FIG. 17 is a view showing an optical receiver of an optical communication system in which a semiconductor optical amplifier apparatus of the present invention is used.

The optical receiver 503 is constructed as shown in FIG. 17. In FIG. 17, reference numeral 523 designates the semiconductor optical amplifier device of the present invention, reference numeral 525 designates a control circuit and reference numeral 526 designates a photodetector (PD). An optical signal from the optical fiber 504 is APC-amplified by the semiconductor optical amplifier device 523 and is converted to an electric signal by the photodetector 526. The control circuit 525 performs the APC control of the semiconductor optical amplifier device 523 and shapes the electric signal from the photodetector 526 to transmit this shaped signal to a desired terminal equipment. In the optical receiver 503 shown in FIG. 17, only one semiconductor optical amplifier device 523 is used as a pre-amplifier. Two or more pre-amplifiers can be used, or no pre-amplifiers may be used only if the optical receiver 503 functions as such.

Figure 15:
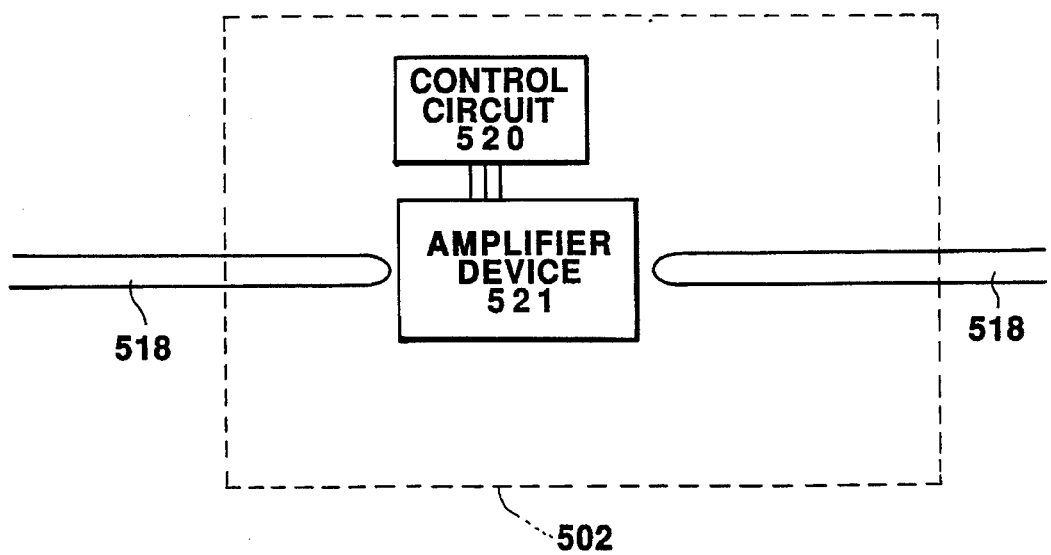
FIG. 15 is a view showing a light amplifying apparatus of an optical communication system in which a semiconductor optical amplifier apparatus of the present invention is used.

The semiconductor light amplifying apparatus 502 can be constructed as shown in FIG. 15 by using a semiconductor optical amplifier device of the present invention. In FIG. 15, reference numeral 518 designates a round-tip fiber, reference numeral 520 designates a control circuit and reference numeral 521 designates a semiconductor optical amplifier device of the present invention. The control circuit 520 is indicated in a form including the control circuit 23 of the third embodiment (see FIG. 8), a power source and so forth, and controls it APC amplification. The optical signal from the optical fiber 504 is coupled to the waveguide of the semiconductor optical amplifier device 521 through the round-tip fiber 518. The optical signal input into the waveguide of the amplifier device 521 is APC-amplified, and its output light is again output into the round-tip fiber 518 to be coupled to the optical fiber 504 of the transmission line. The round-tip fiber 518 is used to effectively couple the light from the optical fiber 504 to the waveguide of the semiconductor optical amplifier device 521 and to effectively couple the output light from the waveguide to the optical fiber 504. There are other ways such as a lens for enhancing such coupling. Further, the semiconductor light amplifying apparatus 502 will function as well even if the tip of the fiber is not rounded, though the coupling efficiency is reduced.

The operation of the optical transmission system as shown in FIG. 9 will be described. In a case where one terminal equipment is connected to the optical transmitter 501, that is, in a case of a uni-directional communication between the terminal equipment in a one to one or one to N (N is a given integer) form, any communication access system can be adopted and a signal can be-transmitted in accordance with any procedure and interval. In the case of a uni-directional N to N communication, a time division multiple access (TDMA), for example, can be used. This is a communication system in which a signal transmission line is divided with respect to time to provide a plurality of transmission lines. In this case, the control circuit 525 in the optical receiver 503 needs to have a function that judges the address information of the received signal and supplies a desired signal to a desired terminal equipment.

The control circuit 524 in the optical transmitter 501 needs to have a function that attaches an address signal to signals received from the terminal equipments and drives the semiconductor laser 522 in accordance with its signal system.

Fifth Embodiment

FIG. 10 shows a bi-directional optical transmission system in which a semiconductor optical amplifier device of the first or second embodiment is used. In FIG. 10, reference numeral 505 designates an optical transmitter-receiver, reference numeral 502 designates a semiconductor optical amplifier device having the same structure as that shown in FIG. 9 and reference numeral 504 designates an optical fiber. The optical transmitter-receiver 505 has a structure in which the optical transmitter 501 and the receiver 503 of the fourth embodiment, for example, are combined. Namely, the output of the optical transmitter 501 and the input of the optical receiver 503 are combined into one by an optical branching-combining device.

Portions of the optical transmitter and receiver in the optical transmitter-receiver BOB are as described in the fourth embodiment. Further, the semiconductor light amplifying apparatus 502 is identical with that in the fourth embodiment. Therefore, explanations of those portions are omitted in this embodiment. As for the communication access system, that of the fourth embodiment can be applied with respect to respective directions.

Sixth Embodiment

Figure 11:
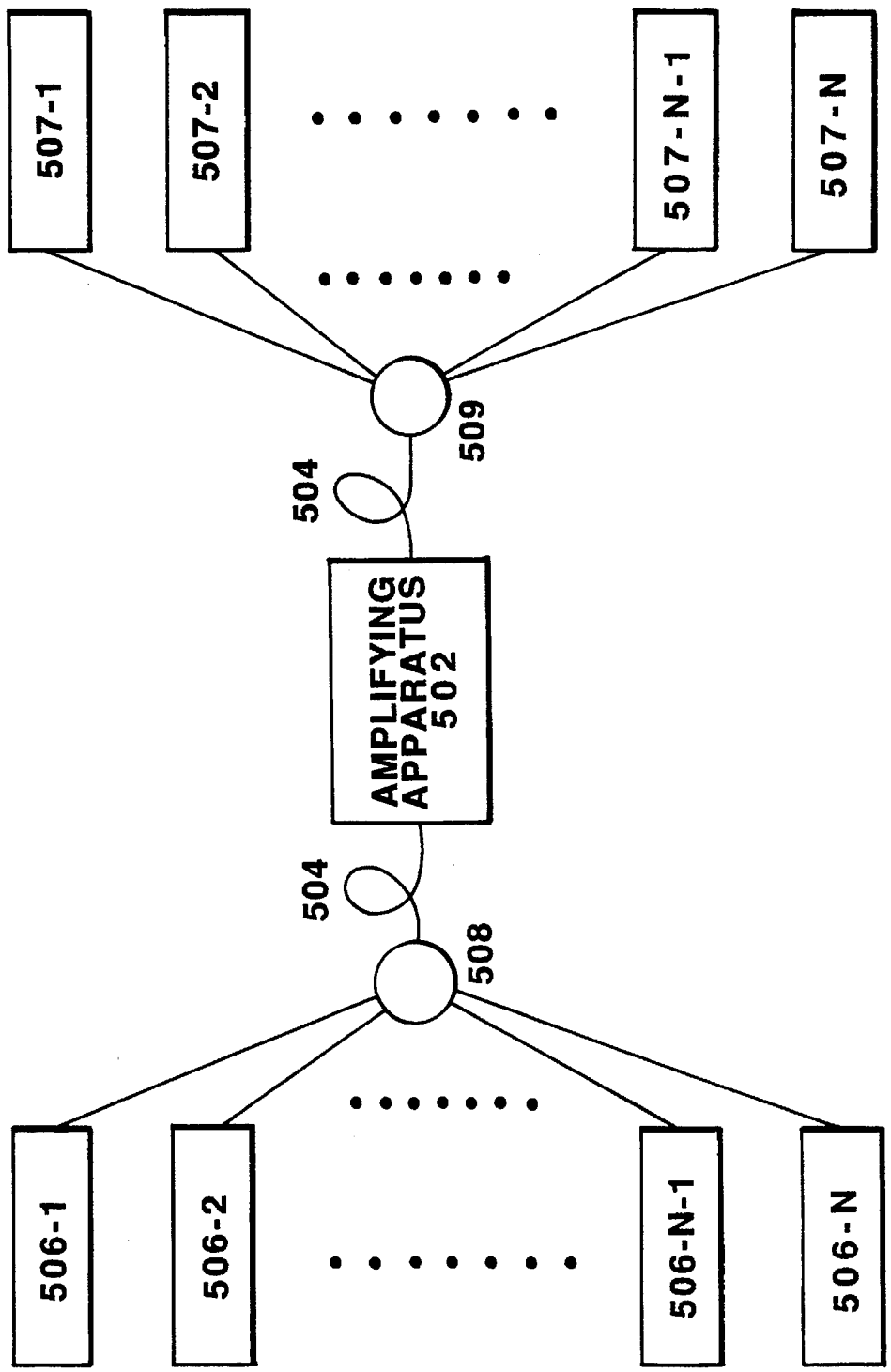
FIG. 11 is a view showing a uni-directional wavelength or frequency division multiplexing optical communication system in which a semiconductor optical amplifier apparatus of the present invention is used.

FIG. 11 shows a uni-directional N to N frequency division multiplexing transmission system in which a semiconductor optical amplifier device of th first or second embodiment is used. In FIG. 11, reference numerals 506-1~506-N repectively designate optical transmitters, reference numeral 508 designates an optical combining device, reference numeral 509 designates an optical branching device and reference numarals 507-1~507-N respectively designate optical receivers. Further, similarly to other embodiments, reference numeral 504 designates an optical fiber and reference numeral 502 designates a semiconductor light amplifying apparatus. The optical transmitters 506-1~506-N respectively have structures as shown in FIG. 16. Semiconductor lasers 522 of the respective transmitters 505-1~506-N respectively oscillate at different wavelengths. The operation is the same as that described with reference to FIG. 16.

Figure 18:
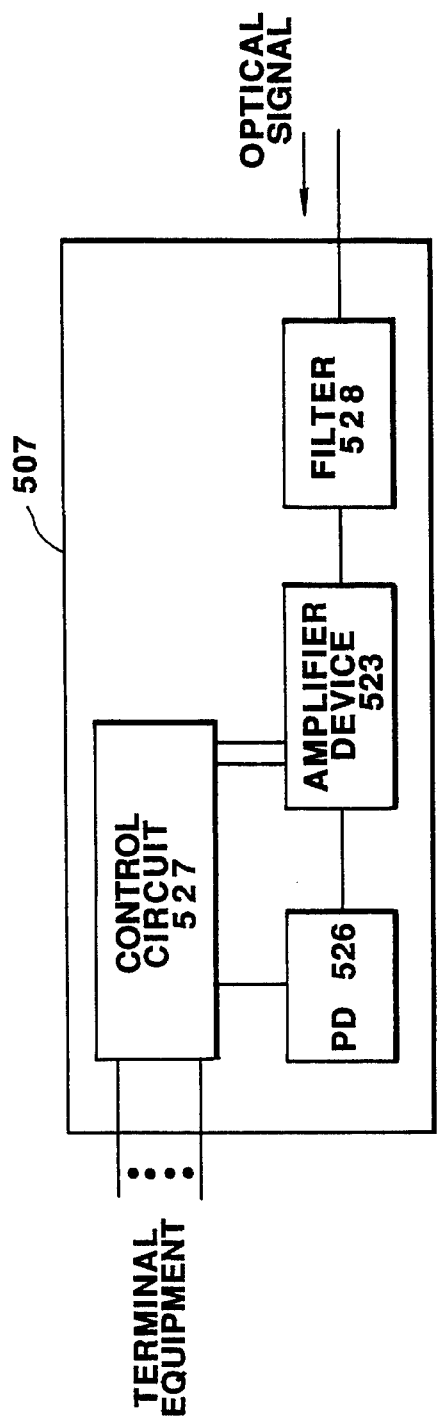
FIG. 18 is a view showing an optical receiver of an optical communication system in which the semiconductor optical amplifier apparatus of the present invention is used.

The optical receivers 507-1~507-N respectively have structures as shown, for example, in FIG. 18. In FIG. 18, reference numeral 526 designates a photodetector, reference numeral 527 designates a control circuit, reference numeral 528 designates an optical band-pass filter and reference numeral 523 designates a semiconductor optical amplifier device of the present invention (this is used as a pre-amplifier). The optical band-pass filter 528 is adjusted so that only a wavelength of the optical transmitter 506-$k$ is transmitted therethrough which corresponds to the optical receiver 507-$k$ containing the optical band-pass filter 528. Thus, light signals of a plurality of wavelengths are transmitted through the transmission line from the optical transmitter 506-$i$ to the optical receiver 507-$i$, and hence a plurality of transmission lines are equivalently formed. This transmission line is constructed by one transmission optical fiber 504 and the semiconductor light amplifying apparatus 502. The transmission access system of a transmission line of one wavelength constructed by the optical transmitter 506-$i$ and the optical receiver 506-$i$ is the same as that in the fifth embodiment. Further, in FIG. 11, the optical band-pass filter 528 in the optical receiver 507 can be omitted by replacing the optical branching device 509 by an optical demultiplexing device.

Seventh Embodiment

Figure 12:
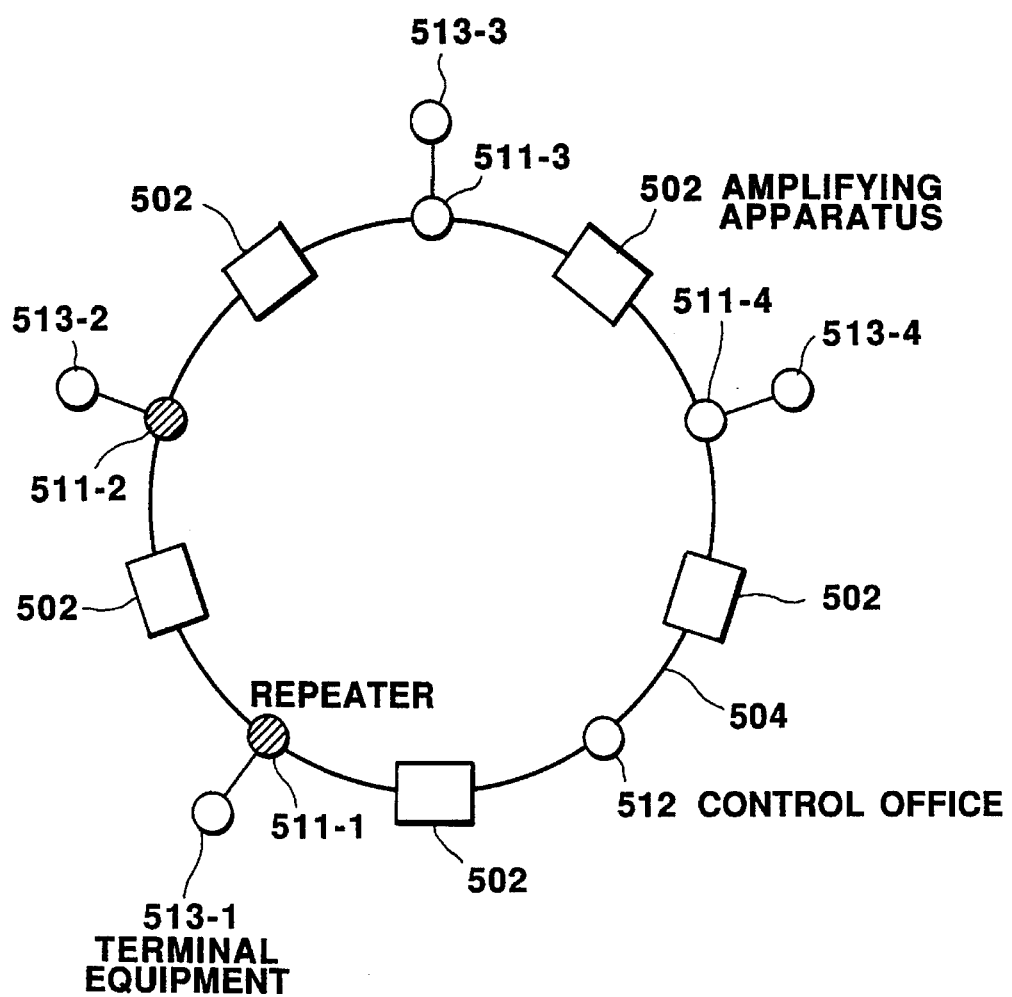
FIG. 12 is a view showing a loop type optical local area network (LAN) in which a semiconductor optical amplifier apparatus of the present invention is used.

FIG. 12 shows a loop type optical LAN in which a semiconductor optical amplifier device of the first or second embodiment is used.

In FIG. 12, reference numerals 511-1~511-4 respectively designate reproduction repeaters, reference numeral 512 designates a control office, reference numeral 513-1~513-4 respectively designate terminal equipments, reference numeral 504 designates an optical fiber, and reference numeral 502 designates a semiconductor light amplifying apparatus (explained in the fourth embodiment).

A conventional access system such as a token ring system can be utilized for tile operation of the loop type LAN.

In this embodiment, the semiconductor light amplifying apparatus 502 using the semiconductor optical amplifier device of the present invention is used between the repeaters 511 as a booster amplifier, so that the reproduction repeater 511-$i$ can always receive the optical signal transmitted from the reproduction repeater 511-($i$-1) at a constant power.

The reproduction repeater 511 generally includes a photodetector (O/E converter), semiconductor laser (E/O converter) and an electric reproduction repeater. Also in this reproduction repeater 511, the semiconductor optical amplifier device of the present invention can be used as a pre-amplifier to be disposed before the photodetector or as a booster amplifier for the semiconductor laser. An input power into the photodetector and an output power from the repeater 511 can be made more stable than those obtained when the semiconductor optical amplifier device of the present invention is not used, by using this semiconductor optical amplifier device in its APC operation in the repeater 511.

One semiconductor light amplifying apparatus 502 is used between the reproduction repeaters 511, but two or more than two amplifying apparatuses can be used when necessary.

Eighth Embodiment

Figure 13:
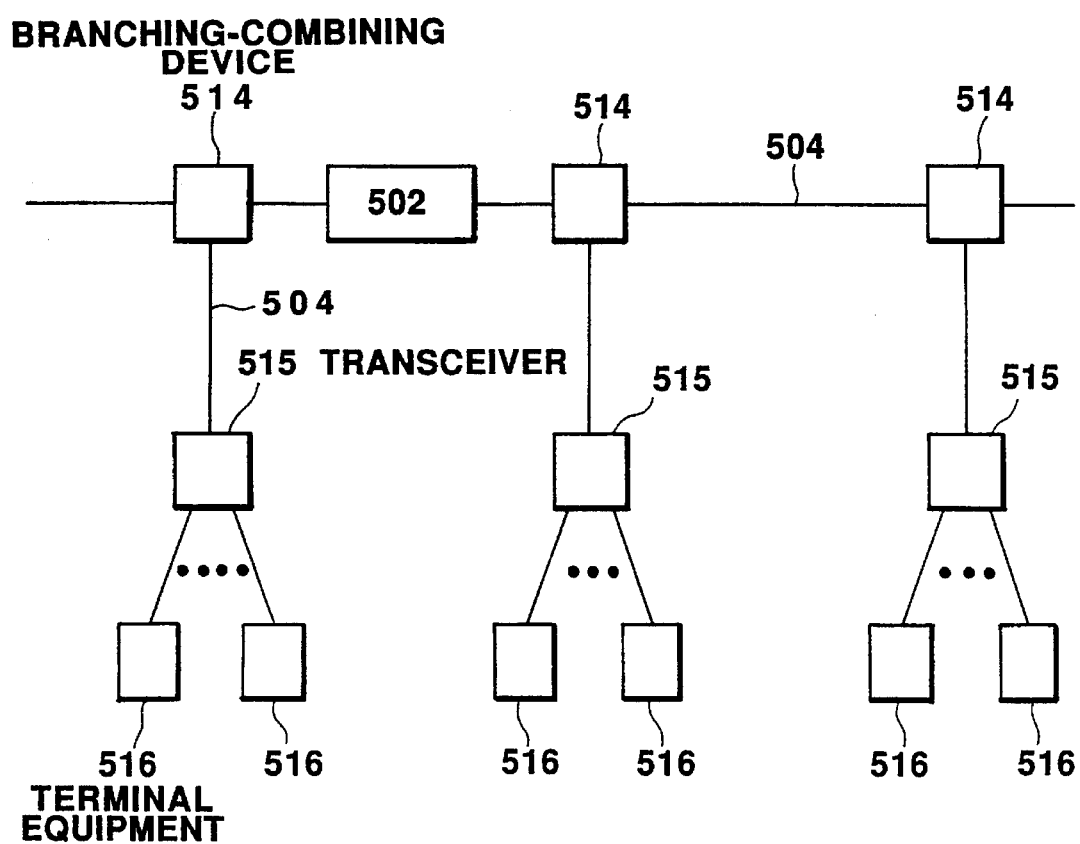
FIG. 13 is a view showing a passive bus type optical local area network (LAN) in which a semiconductor optical amplifier apparatus of the present invention is used.

FIG. 13 shows an embodiment of a bus type optical LAN in which a semiconductor optical amplifier device of the first or second embodiment is used.

In FIG. 13, reference numeral 514 designates 9 light branching-combining device, reference numeral 515 designates an optical transceiver, reference numeral 516 designates a terminal equipment, reference numeral 502 designates a semiconductor light amplifying apparatus (this is explained in the fifth embodiment), and reference numeral 504 designates an optical fiber.

Figure 19:
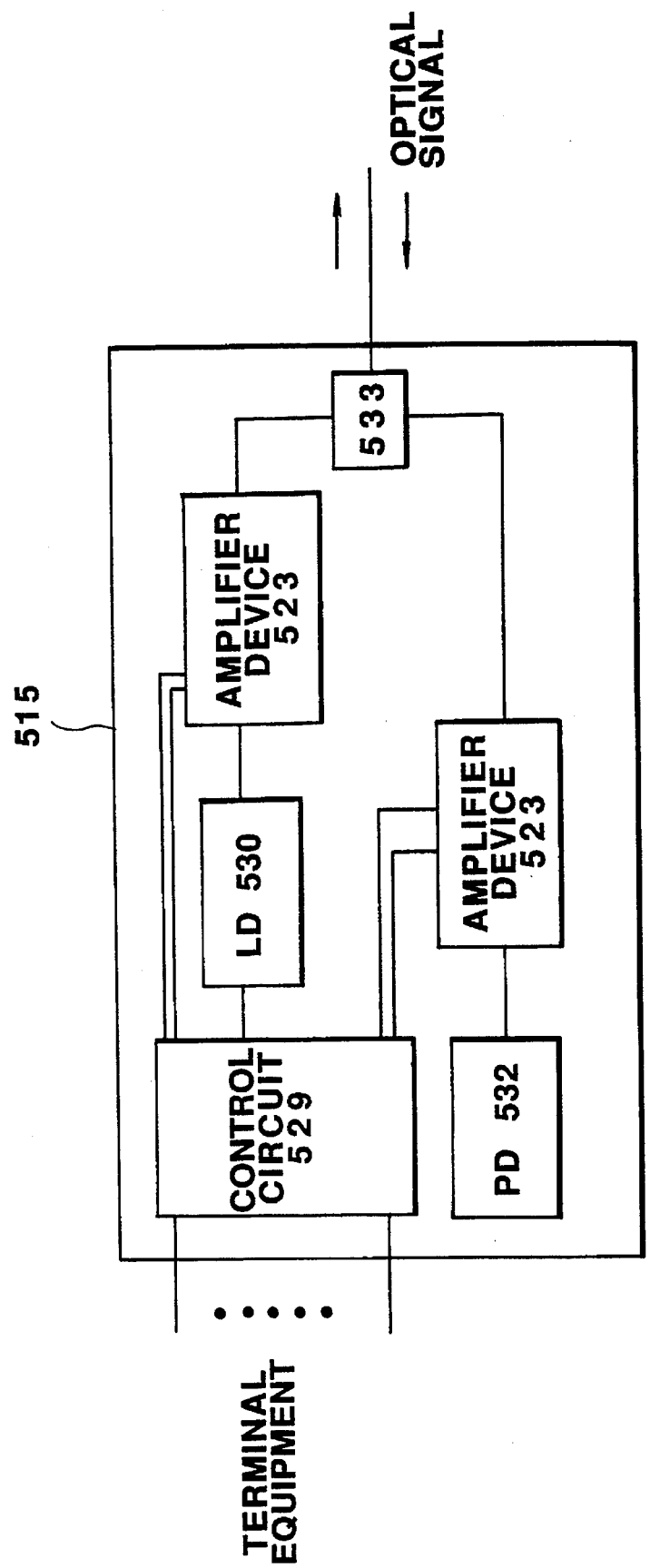
FIG. 19 is a view showing an optical transceiver of an optical communication system in which a semiconductor optical amplifier apparatus of the present invention is used.

The optical transceiver 515 has the structure as shown in FIG. 19. In FIG. 19, reference numeral 529 designates a control circuit, reference numeral 530 designates a semiconductor laser, reference numeral 532 designates a photodetector, reference numeral 533 designates a light branching-combining device and reference numeral 523 designates a semiconductor optical amplifier device of the present invention.

In this bus type optical LAN, CSMA/CD (carrier sense multiple access with collision detection) system, for example, is used as an access system. A token passing, TDMA and so forth can also be used.

A communication demand from the terminal equipment 516 is transmitted to the optical transceiver 515, and the control circuit 529 in the transceiver 515 drives the semiconductor laser 530 in accordance with the communication system optical pulses LAN to transmit optical pulses (optical digital signals). The transmitted optical signal is APC-amplified by the semiconductor optical amplifier device 523, transmitted to the light branching-combining device 514 through the light branching-combining device 533 and the signal is transmitted to the bus line 504. The semiconductor light amplifying apparatus 502 is arranged in some places on the bus line 504, and the optical signal is APC-amplified therein. On the other hand, in a signal receiving procedure, the light signal transmitted through the bus line 504 is branched by the light branching-combining device 514 to be input into the optical transceiver 515. The light signal input into the optical transceiver 515 is branched by the light branching-combining device 533, APC-amplified by the semiconductor optical amplifier device 523 and is received by the photodetector 532 to be converted to an electric signal. The shaping and reproduction of the electric signal is controlled in the control circuit 529, and the signal is supplied to the terminal equipment 516.

In this embodiment, the semiconductor optical amplifier device 523 of the present invention in the optical transceiver 515 is used as booster amplifier and pre-amplifier. A plurality of the amplifier devices can be used, or no amplifier devices can be used as well. Further, at least one semiconductor light amplifying apparatus 502 on the bus line 504 can be disposed in any place between the light branching-combining devices 514, or the amplifying apparatus 502 can be disposed in any manner.

Ninth Embodiment

Figure 14:
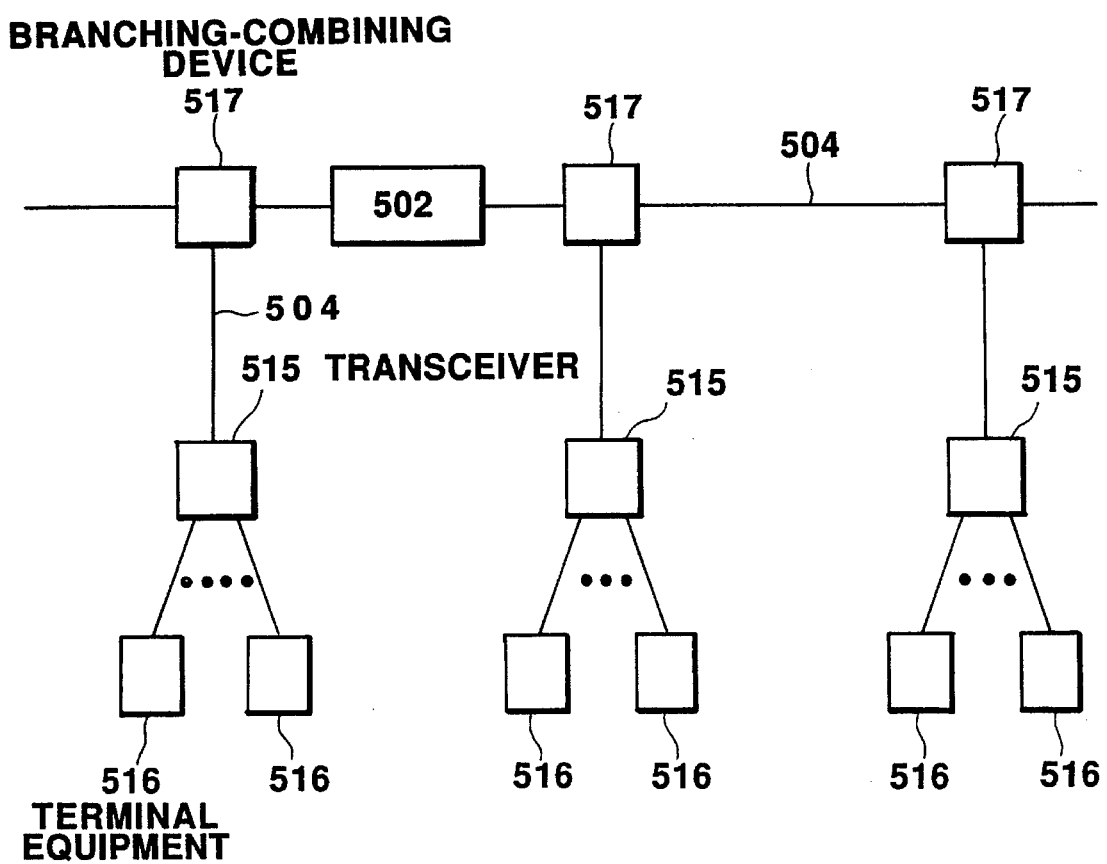
FIG. 14 is a view showing a bus type optical local area network (LAN) in which a semiconductor optical amplifier apparatus of the present invention is used.

FIG. 14 shows an embodiment of a communication system in which a light branching-combining device 517 containing an optical amplifier device for attaining an amplification function is used in place of the light branching-combining device 514 on the bus line 504 of the eighth embodiment.

Figure 20:
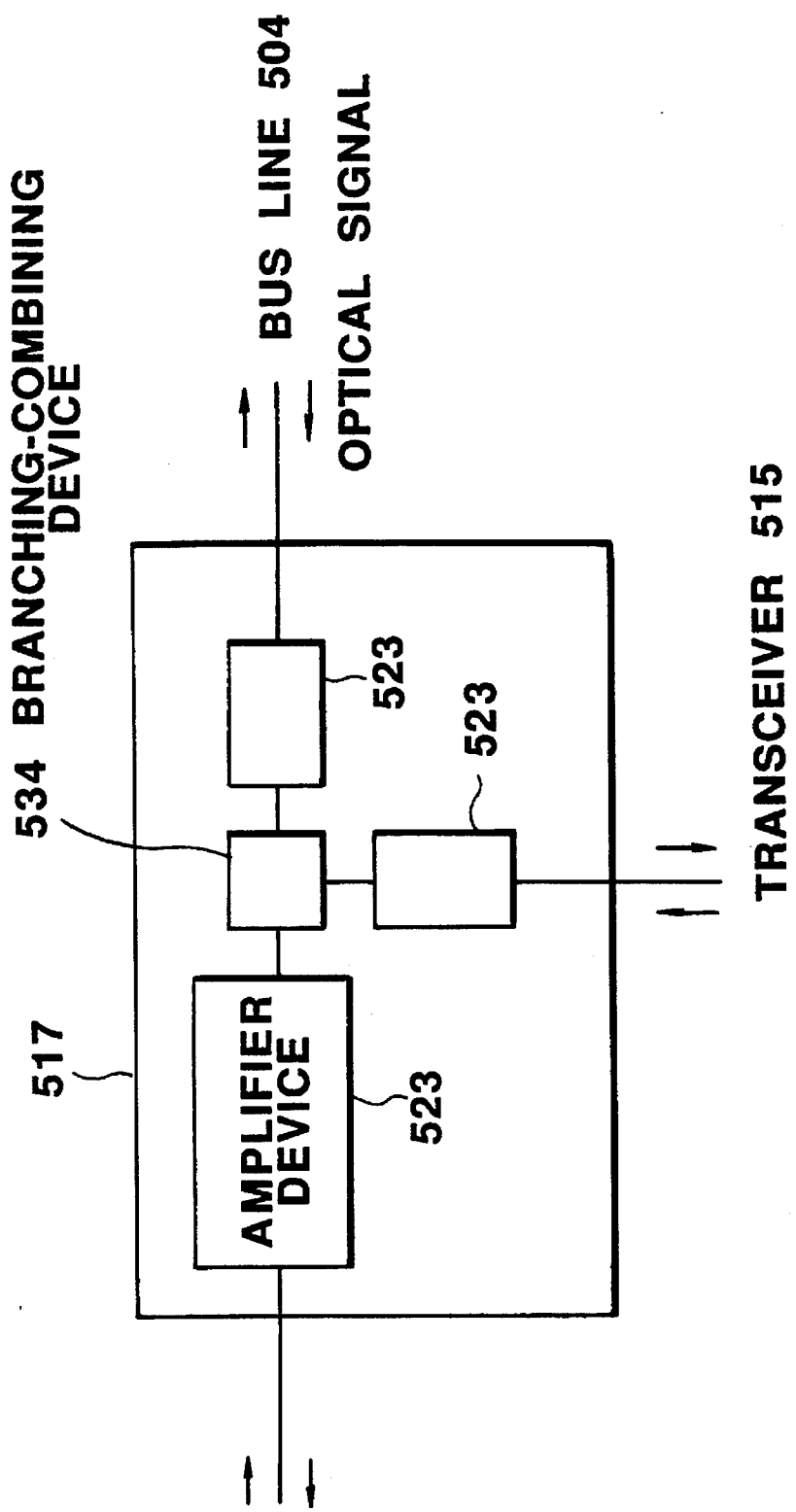
FIG. 20 is a view showing a light branching-combining element (optical coupler) of an optical communication system in which a semiconductor optical amplifier apparatus of the present invention is used.

The light branching-combining device 517 with the optical amplifier device built in can be constructed in a manner as shown in FIG. 20. As shown in FIG. 20, the semiconductor optical amplifier devices 523 of the present invention are disposed in respective input portions (three places ) of a light branching-combining device 534. The communication or access system is the same as that of the eighth embodiment. In this embodiment, the semiconductor light amplifying apparatus 502 can be disposed on the bus line 504 between the light branching-combining devices 517 containing the semiconductor optical amplifier device when necessary.

In the fourth to ninth embodiments, the semiconductor optical amplifier device of the first or second embodiment is used in the optical communication system. However, this amplifier device can be used in any optical communication system in which light is used as an information transmitting medium.

In fourth to ninth embodiments, the optical amplifier device is APC-operated, but this can be used in a constant-current operation (constant-gain operation).

As described in the foregoing, a portion in which a carrier density distribution is uneven in an active region of a waveguide of a semiconductor optical amplifier device is formed in at least a portion of a resonator thereof, so that in the semiconductor optical amplifier device the resonance wavelength remains unchanged even if the amount of its injection current is changed. As a result, the amplification operation is made stable. Further, a more reliable optical communication system can be achieved by using such semiconductor optical amplifier device.

While there have been shown and described what are considered preferred embodiments of the present inventions, it will be obvious to those skilled in the art that various changes and modifications may be made therein without departing from the invention as defined by the claims.

What is claimed is:

1. A semiconductor optical amplifier device comprising:
   a first section and a second section which are arranged along a resonator direction;
   a common electrode for injecting a current into said first and second sections; and
   a waveguide formed through said first and second sections,
   wherein said waveguide has an active layer in the first section and a plurality of active layers in the second section.

2. A semiconductor optical amplifier device according to claim 1,
   wherein $n_1L_1+n_2L_2$ is a constant value regardless of the amount of carriers injected from said common electrode, and
   wherein $n_1$ represents the effective refractive index in the first section, $L_1$ represents the length of the first section in the resonator direction, $n_2$ represents the effective refractive index in the second section and $L_2$ represents the length of the second section in the resonator direction.

3. A semiconductor optical amplifier device according to claim 1, further comprising:
   an antireflection coating formed on an end surface thereof.

4. A uni-directional frequency division multiplexing optical communication system comprising:
   a transmission line; and
   a plurality of optical transmitters for transmitting an optical signal through said transmission line, each said optical transmitter comprising light emitting means for converting an electric signal to the optical signal, control means for driving said light emitting means based on a signal from a terminal equipment to cause said light emitting means to output the optical signal, and a semiconductor optical amplifier device for amplifying the optical signal from said light emitting means, said amplifier device comprising
   a first section and a second section which are arranged along a resonator direction, a common electrode for injecting a current into said first and second sections, and a waveguide formed through said first and second sections, wherein said waveguide has an active layer in the first section and a plurality of active layers in the second section.

5. A uni-directional frequency division multiplexing optical communication system comprising:
   a transmission line; and
   an optical receiver for receiving an optical signal transmitted through said transmission line, said optical receiver comprising a semiconductor optical amplifier device for amplifying the optical signal, said amplifier device comprising, a first section and a second section which are arranged along a resonator direction, a common electrode for injecting a current into said first and second sections, and a waveguide formed through said first and second section, wherein said waveguide has an active layer in the first section and a plurality of active layers in the second section, light detecting means for converting the amplified optical signal to an electric signal, and control means for reproducing the electric signal from said light detecting means to supply a reproduced signal to a terminal equipment.

6. A uni-directional frequency division multiplexing optical communication system comprising:
   a transmission line; and
   a light amplifying apparatus disposed on said transmission line, said light amplifying apparatus comprising a semiconductor optical amplifier device, said amplifier device comprising, a first section and a second section which are arranged along a resonator direction, a common electrode for injecting a current into said first and second sections, and a waveguide formed through said first and second sections, wherein said waveguide has an active layer in the first section and a plurality of active layers in the second section, a source for injecting the injection current into said optical amplifier device, and control means for controlling said source so that an inter-electrode voltage of said optical amplifier device remains unchanged.

7. A loop type optical LAN comprising:
   a transmission line; and
   a light amplifying apparatus disposed on said transmission line, said light amplifying apparatus comprising a semiconductor optical amplifier device, said amplifier device comprising, a first section and a second section which are arranged along a resonator direction, a common electrode for injecting a current into said first and second sections, and a waveguide formed through said first and second sections, wherein said waveguide has an active layer in the first section and a plurality of active layers in the second section, a source for injecting the injection current into said optical amplifier device, and control means for controlling said source so that an inter-electrode voltage of said optical amplifier device remains unchanged.

8. A passive bus type optical LAN comprising:
   a transmission line; and
   a light amplifying apparatus disposed on said transmission line, said light amplifying apparatus comprising a semiconductor optical amplifier device, said amplifier device comprising, a first section and a second section which are arranged along a resonator direction, a common electrode for injecting a current into said first and second sections, and a waveguide formed through said first and second sections, wherein said waveguide has an active layer in the first section and a plurality of active layers in the second section, a source for injecting the injection current into said optical amplifier device, and control means for controlling said source so that an inter-electrode voltage of said optical amplifier device remains unchanged.

9. A passive bus type optical LAN comprising:
   (a) transmission line; and
   (b) an optical transmitter-receiver, said optical transmitter-receiver comprising:
   light emitting means for emitting an optical signal based on an electric signal;
   a first semiconductor optical amplifier device for amplifying the optical signal from said light emitting means, said amplifier device comprising a first section and a second section which are arranged along a resonator direction, a common electrode for injecting current into said first and second sections, and a waveguide formed through said first and second sections, wherein said waveguide has an active layer in the first section and a plurality of active layers in the second section;

light detecting means for converting an optical signal to an electric signal;

a second semiconductor optical amplifier device for amplifying the optical signal to be input into said light detecting means, said amplifier device comprising a first section and a second section which are arranged along a resonator direction, a common electrode for injecting a current into said first and second sections, and a waveguide formed through said first and second sections, wherein said waveguide has an active layer in the first section and a plurality of active layers in the second section;

light branching-combining means disposed between said first and second optical amplifier devices; and control means for driving said light emitting means based on a signal from a terminal equipment to cause said light emitting means to output the optical signal and for reproducing the electric signal from said light detecting means to supply a reproduced signal to the terminal equipment.

10. A loss-compensation type light branching-combining apparatus comprising:

a light branching-combining device having a plurality of input-output ports; and a semiconductor optical amplifier device connected to at least one of said input-output ports of said branching-combining device, said amplifier device comprising a first section and a second section which are arranged along a resonator direction, a common electrode for injecting a current into said first and second sections, and a waveguide formed through said first and second sections, wherein said waveguide has an active layer in the first section and a plurality of active layers in the second section.

11. A passive bus type optical LAN comprising:

(a) a transmission line; and (b) a loss-compensation type light branching-combining apparatus disposed on said transmission line, said loss-compensation type light branching-combining apparatus comprising:

light branching-combining device having a plurality of input-output ports; and a semiconductor optical amplifier device connected to at least one of said input-output ports of said branching-combining device, said amplifier device comprising a first section and a second section which are arranged along a resonator direction, a common electrode for injecting a current into said first and second sections, and a waveguide formed through said first and second sections, wherein said waveguide has an active layer in the first section and a plurality of active layers in the second section.

12. A light amplifying apparatus comprising:

a semiconductor optical amplifier device, said amplifier device comprising a first section and a second section which are arranged along a resonator direction, a common electrode for injecting a current into said first and second sections, and a waveguide formed through said first and second sections, wherein said waveguide has an active layer in the first section and a plurality of active layers in the second section;

a source for injecting the injection current into said optical amplifier device; and control means for controlling said source so that an inter-electrode voltage of said optical amplifier device remains unchanged.

13. A light amplifying apparatus according to claim 12, further comprising coupling means for coupling light to said optical amplifier device.

14. A light amplifying apparatus according to claim 13, wherein said coupling means comprises a round-tip optical fiber.

15. An optical transmitter comprising:

light emitting means for converting an electric signal to an optical signal;

control means for driving said light emitting means based on a signal from a terminal equipment to cause said light emitting means to output the optical signal; and a semiconductor optical amplifier device for amplifying the optical signal from said light emitting means, said amplifier device comprising a first section and a second section which are arranged along a resonator direction, a common electrode for injecting a current into said first and second sections, and a waveguide formed through said first and second sections, wherein said waveguide has an active layer in the first section and a plurality of active layers in the second section.

16. An optical receiver comprising:

a semiconductor optical amplifier device for amplifying an optical signal, said amplifier device comprising a first section and a second section which are arranged along a resonator direction, a common electrode for injecting a current into said first and second sections, and a waveguide formed through said first and second sections, wherein said waveguide has an active layer in the first section and a plurality of active layers in the second section;

light detecting means for converting the amplified optical signal to an electric signal; and control means for reproducing the electric signal from said light detecting means to supply a reproduced signal to a terminal equipment.

17. An optical receiver according to claim 16, wherein said light detecting means comprises a band-pass filter.

18. A uni-directional optical communication system comprising:

a transmission line; and a light amplifying apparatus disposed on said transmission line, said light amplifying apparatus comprising a semiconductor optical amplifier device, said amplifier device comprising, a first section and a second section which are arranged along a resonator direction, a common electrode for injecting a current into said first and second sections, and a waveguide formed through said first and second sections, wherein said waveguide has an active layer in the first section and a plurality of active layers in the second section, source means for injecting the injection current into said optical amplifier device, and control means for controlling said source means so that an inter-electrode voltage of said optical amplifier device remains unchanged.

19. A uni-directional optical communication system comprising:

a transmission line; and an optical transmitter for transmitting an optical signal through said transmission line, said optical transmitter comprising light emitting means for converting an electric signal to the optical signal, control means for driving said light emitting means based on a signal from a terminal equipment to cause said light emitting means to output the optical signal, and a semiconductor optical amplifier device for amplifying the optical signal from said light emitting means, said amplifier device comprising a first section and a second section which are arranged along a resonator direction, a common electrode for injecting a current into said first and second sections, and a waveguide formed through said first and second sections, wherein said waveguide has an active layer in the first section and a plurality of active layers in the second section.

20. A uni-directional optical communication system comprising:

a transmission line; and an optical receiver for receiving an optical signal transmitted through said transmission line, said optical receiver comprising a semiconductor optical amplifier device for amplifying the optical signal, said amplifier device comprising, a first section and a second section which are arranged along a resonator direction, a common electrode for injecting a current into said first and second sections, and a waveguide formed through said first and second sections, wherein said waveguide has an active layer in the first section and a plurality of active layers in the second section, light detecting means for converting the amplified optical signal to an electric signal, and control means for reproducing the electric signal from said light detecting means to supply a reproduced signal to a terminal equipment.

21. An optical transmitter-receiver comprising:

light emitting means for emitting an optical signal based on an electric signal;

a first semiconductor optical amplifier device for amplifying the optical signal from said light emitting means, said amplifier device comprising a first section and a second section which are arranged along a resonator direction, a common electrode for injecting a current into said first and second sections, and a waveguide formed through said first and second sections, wherein said waveguide has an active layer in the first section and a plurality of active layers in the second section;

light detecting means for converting an optical signal to an electric signal;

a second semiconductor optical amplifier device for amplifying the optical signal to be input into said light detecting means, said second amplifier device comprising a first section and a second section which are arranged along a resonator direction, a common electrode for injecting a current into said first and second sections, and a waveguide formed through said first and second sections, wherein said waveguide has an active layer in the first section and a plurality of active layers in the second section;

light branching-combining means disposed between said first and second optical amplifier devices; and control means for driving said light emitting means based on a signal from a terminal equipment to cause said light emitting means to output the optical signal and for reproducing the electric signal from said light detecting means to supply a reproduced signal to the terminal equipment.

22. A bi-directional optical communication system comprising:

a transmission line; and a light amplifying apparatus disposed on said transmission line, said light amplifying apparatus comprising a semiconductor optical amplifier device, said amplifier device comprising, a first section and a second section which are arranged along a resonator direction, a common electrode for injecting a current into said first and second sections, and a waveguide formed through said first and second sections, wherein said waveguide has an active layer in the first section and a plurality of active layers in the second section, a source for injecting the injection current into said optical amplifier device, and control means for controlling said source so that an inter-electrode voltage of said optical amplifier device remains unchanged.

23. A bi-directional optical communication system comprising:

(a) a transmission line; and (b) an optical transmitter-receiver, said optical transmitter-receiver comprising:

light emitting means for emitting an optical signal based on an electric signal;

a first semiconductor optical amplifier device for amplifying the optical signal from said light emitting means, said amplifier device comprising a first section and a second section which are arranged along a resonator direction, a common electrode for injecting a current into said first and second sections, and a waveguide formed through said first and second sections, wherein said waveguide has an active layer in the first section and a plurality of active layers in the second section;

light detecting means for converting an optical signal to an electric signal;

a second semiconductor optical amplifier device for amplifying the optical signal to be input into said light detecting means, said second amplifier device comprising a first section and a second section which are arranged along a resonator direction, a common electrode for injecting a current into said first and second sections, and a waveguide formed through said first and second sections, wherein said waveguide has an active layer in the first section and a plurality of active layers in the second section;

light branching-combining means disposed between said first and second optical amplifier devices; and control means for driving said light emitting means based on a signal from a terminal equipment to cause said light emitting means to output the optical signal and for reproducing the electric signal from said light detecting means to supply a reproduced signal to the terminal equipment.

* * * * *

UNITED STATES PATENT AND TRADEMARK OFFICE
CERTIFICATE OF CORRECTION

PATENT NO. : 5,471,335

DATED : November 28, 1995

INVENTOR(S): NITTA

It is certified that error appears in the above-identified patent and that said Letters Patent is hereby corrected as shown below:

ON THE TITLE PAGE:

Item [56]; References Cited

Line FPD, Insert: "3-22581 1/91 Japan"

Line FPD, "0238212 of 0000 Euro. Pat. Off.;0128297 of 0000 Euro. Pat. Off." should read --0238212 of 9/1987 Euro. Pat. Off. ; 0128297 of 12/1984 Euro. Pat. Off.--.

Line OP, In "Mikami et al." "Emmission" should read --Emission--.

COLUMN 2

Line 22, "a nd" should read --and--.

Line 23, "leasta" should read --least a--.

Line 55, "tile" should read --the--.

UNITED STATES PATENT AND TRADEMARK OFFICE
CERTIFICATE OF CORRECTION

PATENT NO. : 5,471,335

DATED : November 28, 1995

INVENTOR(S): NITTA

It is certified that error appears in the above-identified patent and that said Letters Patent is hereby corrected as shown below:

COLUMN 3

Line 40, ",is" should read --is--.

COLUMN 4

Line 24, "in." should read --in--.

Line 28, "tile" should read --the--.

Line 49, "$n_1L_1+n_2L_2$." should read --$n_1L_1+n_2L_2$--.

COLUMN 7

Line 24, "it" should read --its--.

Line 46, "be-transmitted" should read --be transmitted--.

UNITED STATES PATENT AND TRADEMARK OFFICE
CERTIFICATE OF CORRECTION

PATENT NO. : 5,471,335

DATED : November 28, 1995

INVENTOR(S): NITTA

It is certified that error appears in the above-identified patent and that said Letters Patent is hereby corrected as shown below:

<u>COLUMN 8</u>

Line 12, "BOB" should read --505--.

Line 57, "receiver 506-$i$" should read --receiver 507-$i$--.

<u>COLUMN 9</u>

Line 9, "tile" should read --the--.

Line 40, "9" should read --a--.

Line 64, "system optical pulses" should read --system of the optical--.

<u>COLUMN 10</u>

Line 67, "inventions," should read --invention,--.

UNITED STATES PATENT AND TRADEMARK OFFICE
CERTIFICATE OF CORRECTION

PATENT NO. : 5,471,335

DATED : November 28, 1995

INVENTOR(S) : NITTA

It is certified that error appears in the above-identified patent and that said Letters Patent is hereby corrected as shown below:

<u>COLUMN 11</u>

Line 42, Close up right margin.

Line 62, "section," should read --sections,--.

Signed and Sealed this

Eleventh Day of June, 1996

BRUCE LEHMAN

*Attest:*

*Attesting Officer*    Commissioner of Patents and Trademarks